(12) United States Patent
Kawanami et al.

(10) Patent No.: US 8,279,605 B2
(45) Date of Patent: Oct. 2, 2012

(54) POWER SEMICONDUCTOR MODULE

(75) Inventors: Yasuhiko Kawanami, Kitakyushu (JP);
Tasuku Isobe, Kitakyushu (JP)

(73) Assignee: Kabushiki Kaisha Yaskawa Denki,
Kitakyushu-Shi (JP)

( * ) Notice: Subject to any disclaimer, the term of this patent is extended or adjusted under 35 U.S.C. 154(b) by 27 days.

(21) Appl. No.: 12/877,112

(22) Filed: Sep. 8, 2010

(65) Prior Publication Data

US 2011/0057713 A1 Mar. 10, 2011

Related U.S. Application Data

(63) Continuation of application No. PCT/JP2009/054317, filed on Mar. 6, 2009.

(30) Foreign Application Priority Data

Jun. 12, 2008 (JP) ................................. 2008-153626
Nov. 5, 2008 (JP) ................................. 2008-283968
Mar. 3, 2009 (JP) ................................. 2009-049840

(51) Int. Cl.
*H05K 7/20* (2006.01)

(52) U.S. Cl. ........ 361/704; 361/707; 361/709; 361/710; 361/711

(58) Field of Classification Search ................. 361/704, 361/707, 709–711
See application file for complete search history.

(56) References Cited

U.S. PATENT DOCUMENTS

| 5,532,512 | A | * | 7/1996 | Fillion et al. | 257/686 |
| 6,317,326 | B1 | * | 11/2001 | Vogel et al. | 361/704 |
| 6,697,257 | B1 | * | 2/2004 | Wolf et al. | 361/708 |
| 6,829,149 | B1 | * | 12/2004 | Chang et al. | 361/771 |
| 7,078,803 | B2 | * | 7/2006 | Tilton et al. | 257/714 |
| 7,629,684 | B2 | * | 12/2009 | Alcoe et al. | 257/720 |
| 7,738,249 | B2 | * | 6/2010 | Chan et al. | 361/679.53 |
| 2006/0232942 | A1 | | 10/2006 | Nakatsu et al. | |
| 2008/0224303 | A1 | | 9/2008 | Funakoshi et al. | |

FOREIGN PATENT DOCUMENTS

| JP | 2000-174180 | 6/2000 |
| JP | 2004-22844 | 1/2004 |
| JP | 2004-296663 | 10/2004 |
| JP | 2005-123233 | 5/2005 |
| JP | 2005-192335 | 7/2005 |
| JP | 2005-303018 | 10/2005 |
| JP | 2006-174566 | 6/2006 |
| JP | 2006-286676 | 10/2006 |
| JP | 2008-124430 | 5/2008 |

OTHER PUBLICATIONS

International Search Report for International Application No. PCT/JP2009/054317, Jun. 9, 2009.
Written Opinion of the International Searching Authority for International Application No. PCT/JP2009/054317, Jun. 9, 2009.

* cited by examiner

*Primary Examiner* — Kenneth B. Wells
(74) *Attorney, Agent, or Firm* — Ditthavong Mori & Steiner, P.C.

(57) ABSTRACT

The present invention provides a power module in which a first semiconductor device disposed on a first substrate and a second semiconductor device disposed on a second substrate are disposed at symmetrical positions with a third substrate interposed therebetween.

16 Claims, 13 Drawing Sheets

POWER SEMICONDUCTOR MODULE

CROSS-REFERENCE TO RELATED APPLICATIONS

The present application is a continuation application of PCT/JP2009/054317, filed Mar. 6, 2009, which claims priority to Japanese Patent Applications No. 2008-153626, filed Jun. 12, 2008, No. 2008-283968, filed Nov. 5, 2008 and No. 2009-049840, filed Mar. 3, 2009. The contents of these applications are incorporated herein by reference in their entirety.

BACKGROUND OF THE INVENTION

1. Field of the Invention

The present invention relates to a power module used in a motor control device.

2. Discussion of the Background

A conventional power module mounted on a motor control device such as an inverter or a servo amplifier is typically provided with a plurality of semiconductor devices (for example, six semiconductor chips and six freewheeling diodes) disposed on an insulated circuit board. As examples of such a semiconductor device, there has been known a so-called IGBT (Insulated Gate Bipolar Transistor) module having an IGBT therein, and an intelligent power module configured by an IGBT module with a gate drive circuit or a protection circuit. This type of a power module is disclosed in Japanese Unexamined Patent Application Publication No. 2005-123233. The Publication describes a cooling structure of a power module in which heat sinks are joined respectively to both sides of a semiconductor chip, and coolers are provided respectively over these heat sinks.

SUMMARY OF THE INVENTION

According to one aspect of the present invention,
a power module includes:
a first semiconductor device provided with a first FET,
a first substrate electrically connected to the first semiconductor device;
a second semiconductor device provided with a second FET;
a second substrate on a surface of which the second semiconductor device is disposed; and
a third substrate on a surface of which and a back surface facing away of the surface a first metallic plate and a second metallic plate are respectively disposed, the first metallic plate and the second metallic plate being respectively connected with the first semiconductor device and the second semiconductor device, wherein
the third substrate has a function of a capacitor for accumulating a charge, and
a plurality of metallic layers and a plurality of insulation layers are formed between the first metallic plate and the second metallic plate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
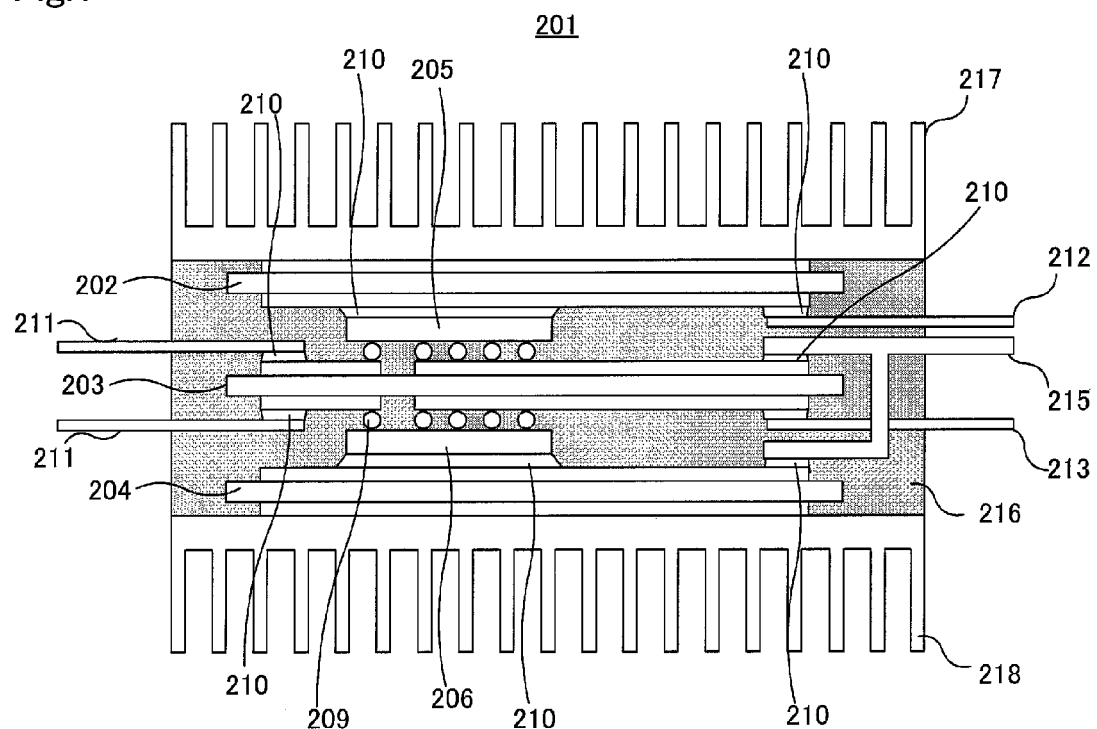
FIG. 1 is a cross-sectional view illustrating a power module according to an embodiment of the present invention.

Embodiments will now be described with reference to the accompanying drawings, wherein like reference numerals designate corresponding or identical elements throughout the various drawings.

FIG. 1 illustrates a cross-sectional view of a power module 201 according to this embodiment. According to the power module 201, the heat generated within the module is radiated from an upper and a lower surface of the power module. Therefore, this power module is also referred to as a double-side radiating power module.

The power module 201 is provided with a first substrate 202, a second substrate 204, a third substrate 203, a first semiconductor device 205, and a second semiconductor device 206. The first semiconductor device 205 is disposed over the first substrate 202 with a joining member 210 interposed therebetween, and fixed onto the first substrate 202. Similarly, the second semiconductor device 206 is disposed over the second substrate 204 with the joining member 210 interposed therebetween, and fixed onto the second substrate 204.

Within the first semiconductor device 205 and the second semiconductor device 206, a first MOSFET and a second MOSFET are respectively formed using a well-known method of manufacturing semiconductor devices. These MOSFETs are formed on silicon substrates whose main component is silicon (Si).

The third substrate 203 is provided between the first semiconductor device 205 over the first substrate 202 and the second semiconductor device 206 over the second substrate 204. As the third substrate 203, an insulated circuit board where electrical wiring is formed on a surface and in an interior thereof is used. As the first substrate 202 and the second substrate 204, insulated substrates are used. It is desirable that these insulated substrates are made of a material having high exoergic property. The first semiconductor device 205 and the second semiconductor device 206 are disposed at symmetrical positions with the third substrate 203 interposed therebetween.

The power module 201 is further provided with soldering balls 209 that electrically connect the first semiconductor device 205 and the second semiconductor device 206 with the wiring disposed over the third substrate 203. According to this embodiment, the soldering balls 209 whose main component is soldering are used. However, the soldering balls 209 can be conductive members made of any material and into any shape as long as the devices and the wiring can be electrically connected. The wiring formed on or within the third substrate will not be described in detail for the sake of simplicity of explanation.

According to this embodiment, in order to cause the power module 201 to function as an inverter, the power module 201 is further provided with metal wiring for gate signals 211, metal wiring for a P terminal 212, metal wiring for an N terminal 213, and a busbar 215 for direct coupling to semiconductors of upper and lower arms also serving as an output terminal, and sealed by a resin member 216 using a well-known method of sealing as shown in FIG. 1. Further, a first heat sink 217 is formed on a back surface of the first substrate 202 via fixing means such as an adhesive material, and a second heat sink 218 formed on a back surface of the second substrate 204 similarly via the fixing means.

According to this embodiment, a third semiconductor device and a fifth semiconductor device are further formed on the first substrate 202 (not shown in FIG. 1). A third MOSFET and a fifth MOSFET are respectively formed within the third semiconductor device and the fifth semiconductor device. Similarly, a fourth semiconductor device and a sixth semiconductor device are further formed on the second substrate 204 (not shown in FIG. 1). A fourth MOSFET and a sixth MOSFET are respectively formed within the fourth semiconductor device and the sixth semiconductor device. These MOSFETs, similarly to the first and the second MOSFET, are respectively formed using a well-known method of manufacturing semiconductor devices on silicon substrates whose main component is silicon (Si).

Figure 2:
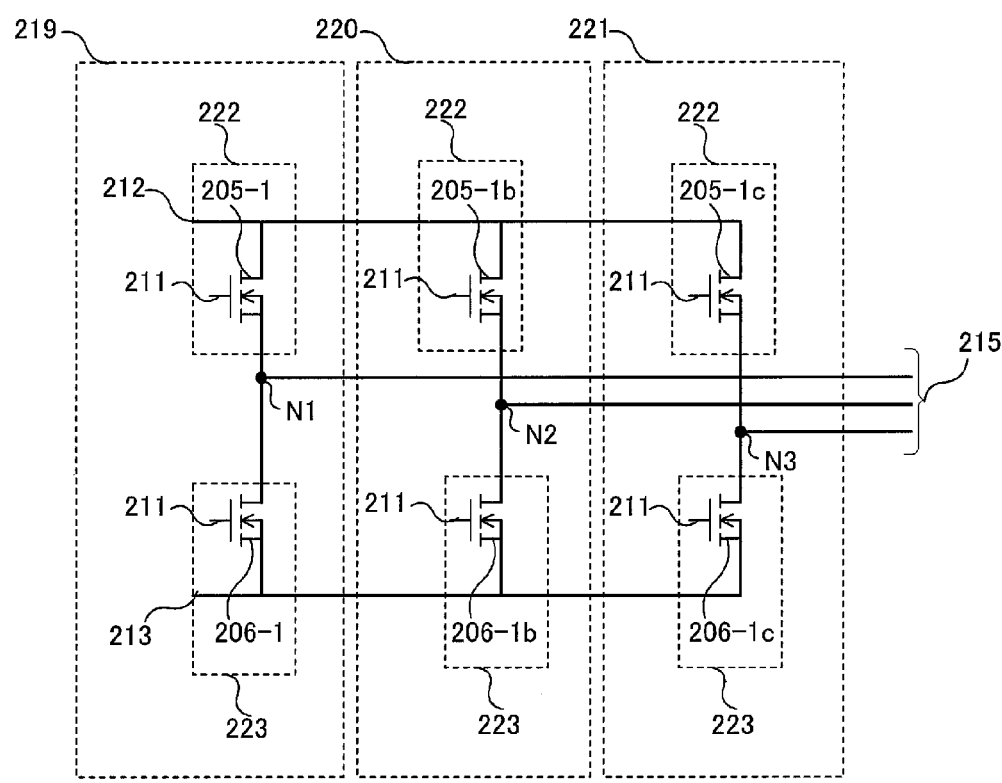
FIG. 2 is a circuit diagram of a three-phase inverter circuit.

The first to sixth MOSFETs thus constitute a three-phase inverter circuit. The three-phase inverter circuit is described below with reference to FIG. 2.

The three-phase inverter circuit is provided with a first inverter circuit 219 configured by the first semiconductor device 205 and the second semiconductor device 206, a second inverter circuit 220 configured by a third semiconductor device 205b and a fourth semiconductor device 206b, and a third inverter circuit 221 configured by a fifth semiconductor device 205c and a sixth semiconductor device 206c.

In the first inverter circuit 219, a first MOSFET 205-1 and a second MOSFET 206-1 are connected in series via a first connection node N1. According to this embodiment, the MOSFET refers to an N channel MOSFET unless otherwise stated.

One electrode of the first MOSFET 205-1 is connected to the first connection node N1, the other electrode is connected to the metal wiring for the P terminal 212, and a gate electrode is connected to the metal wiring for gate signals 211. One electrode of the second MOSFET 206-1 is connected to the first connection node N1, the other electrode is connected to the metal wiring for the N terminal 213, and a gate electrode is connected to the metal wiring for gate signals 211.

In the second inverter circuit 220, a third MOSFET 205-1b and a fourth MOSFET 206-1b are connected in series via a second connection node N2. One electrode of the third MOSFET 205-1b is connected to the second connection node N2, the other electrode is connected to the metal wiring for the P terminal 212, and a gate electrode is connected to the metal wiring for gate signals 211. One electrode of the fourth MOSFET 206-1b is connected to the second connection node N2, the other electrode is connected to the metal wiring for the N terminal 213, and a gate electrode is connected to the metal wiring for gate signals 211.

In the third inverter circuit 221, a fifth MOSFET 205-1c and a sixth MOSFET 206-1c are connected in series via a third connection node N3. One electrode of the fifth MOSFET 205-1c is connected to the third connection node N3, the other electrode is connected to the metal wiring for the P terminal 212, and a gate electrode is connected to the metal wiring for gate signals 211. One electrode of the sixth MOSFET 206-1c is connected to the third connection node N3, the other electrode is connected to the metal wiring for the N terminal 213, and a gate electrode is connected to the metal wiring for gate signals 211.

Here, a parasitic diode (not shown in the drawing) is formed for each MOSFET. The first to third connection nodes N1, N2, and N3 are connected to the busbar 215 for direct coupling to the semiconductors of the upper and lower arms also serving as the output terminal.

According to such a three-phase inverter circuit of this embodiment, the first inverter circuit is referred to as a U phase, the second inverter circuit is referred to as a V phase, and the third inverter circuit is referred to as a W phase. Further, the first, third, and fifth MOSFETs 205-1, 205-1b, and 205-1c are referred to as the upper arm, and the second, fourth, and sixth MOSFETs 206-1, 206-1b, and 206-1c are referred to as the lower arm. In the description below, these names are also used.

According to this embodiment, the description is given assuming that the first to sixth semiconductor devices are separately formed. In this case, the first, third, and fifth semiconductor devices, i.e., the upper arm, and the second, fourth, and fifth semiconductor devices, i.e., the lower arm are disposed at symmetrical positions with the third substrate 203 interposed therebetween. In addition, it is desirable that the wiring patterns and such in the respective semiconductor devices are substantially the same as long as physically possible. With this, configurations of the devices of the upper arm and the devices of the lower arm become equivalent with the third substrate 203 interposed therebetween, thereby efficient radiation can be expected.

Here, when the first, third, and fifth semiconductor devices are formed within the single semiconductor device 205 that is formed on the first substrate 202, and the second, fourth, and sixth semiconductor devices are formed within the single semiconductor device 206 that is formed on the second substrate 204, these semiconductor devices 205 and 206 are disposed at symmetrical positions with the third substrate 203 interposed therebetween. Further, it is desirable that the wiring patterns and such in the respective semiconductor devices are substantially the same as long as physically possible. The following description is given assuming that the first, third, and fifth semiconductor devices are formed within the single semiconductor device 205 that is formed on the first substrate 202, and the second, fourth, and sixth semiconductor devices are formed within the single semiconductor device 206 that is formed on the second substrate 204, for the sake of simplicity of explanation.

By disposing the semiconductor devices that constitute the upper arm and the semiconductor devices that constitute the lower arm of the inverter circuit in this manner at symmetrical positions with an insulating member such as the third substrate interposed therebetween, the heat generated from the semiconductor devices can be efficiently radiated through the both sides of the power module. With this, it is possible to reduce a thermal resistance and a junction temperature. As it is further possible to reduce a heat cycle $\Delta Tj$, a highly reliable power module with longer life duration and reduced heat cycle can be realized.

Further, by making the wiring patterns in the respective semiconductor devices and other components on the first substrate and the second substrate substantially the same as long as physically possible, the upper arm and the lower arm are disposed in a strictly symmetrical manner with the third substrate interposed therebetween. Therefore, the heat generated from the semiconductor devices can be efficiently radiated through an upper and a lower surface of the power module.

According to this embodiment, each MOSFET uses a semiconductor device that is formed on a silicon substrate whose main component is silicon (Si). This type of a semiconductor device is currently commonly used and its junction temperature is around 120 degrees C. However, in the case in which a substrate made of silicon carbide (SiC) or gallium nitride (GaN) as a main component is used to improve power density in order to reduce the size, the junction temperature of a transistor formed on such a substrate reaches up to 200 degrees C. or higher. In other words, in the case in which a semiconductor device in which a substrate made of silicon carbide (SiC) or gallium nitride (GaN) as a main component is used is applied for the power module, the burden that is given to the module by the heat cycle dramatically increases in comparison with the case of the semiconductor device using a silicon substrate.

It is possible to expect a great benefit by applying the structure of the present invention to such a power module using a silicon carbide (SiC) substrate or a gallium nitride (GaN) substrate.

Here, a manufacturing method according to this embodiment is described with reference to FIG. 1.

The first semiconductor device 205 is stacked over a semiconductor device attachment surface of a metal wiring surface of the first substrate 202 with the joining member 210 and a solder foil interposed therebetween. The metal wiring for gate signals 211, the metal wiring for the P terminal 212, the metal wiring for the N terminal 213, and the busbar 215 for direct coupling to the semiconductors of the upper and lower arms also serving as the output terminal are stacked over with the joining member 210 interposed therebetween. Subsequently, the joining member 210 is melted and hardened by reflowing using a heater, thereby forming the upper arm. Similarly, the second semiconductor device 206 and the metal wiring for gate signals 211, the metal wiring for the P terminal 212, and the metal wiring for the N terminal 213 are joined to a semiconductor device attachment surface of the third substrate 203, thereby forming the lower arm.

Next, the soldering balls 209 are mounted on the second semiconductor device 206. Further, the soldering balls 209 are mounted on a joining portion between the third substrate 203 and the first semiconductor device 205.

Then, the first semiconductor device 205 of the upper arm and the second semiconductor device 206 of the lower arm are respectively brought into contact with an upper surface and a lower surface of the third substrate 203 with the soldering balls 209 interposed therebetween. The busbar 215 for direct coupling to the semiconductors of the upper and lower arms also serving as the output terminal is attached with the joining member 210 interposed therebetween, and the soldering balls 209 and the joining member 210 are melted and hardened by reflowing using the heater, thereby the semiconductor devices of the upper and lower arms are electrically and thermally joined.

Subsequently, the resin member 216 is filled into a mold that is not shown in the drawing and hardened. The resin member is taken out of the mold after the hardening, and then, the first heat sink 217 and the second heat sink 218 are fixed by stacking using such as a heat conductive grease or a heat conductive sheet (not shown in the drawing) interposed therebetween, thereby the double-side radiating power module 201 is finished.

Next, the junction temperature of the semiconductor device in the case in which the power module according to this embodiment is operated is described with reference to FIGS. 3A and 3B and FIG. 4.

Figure 3A:
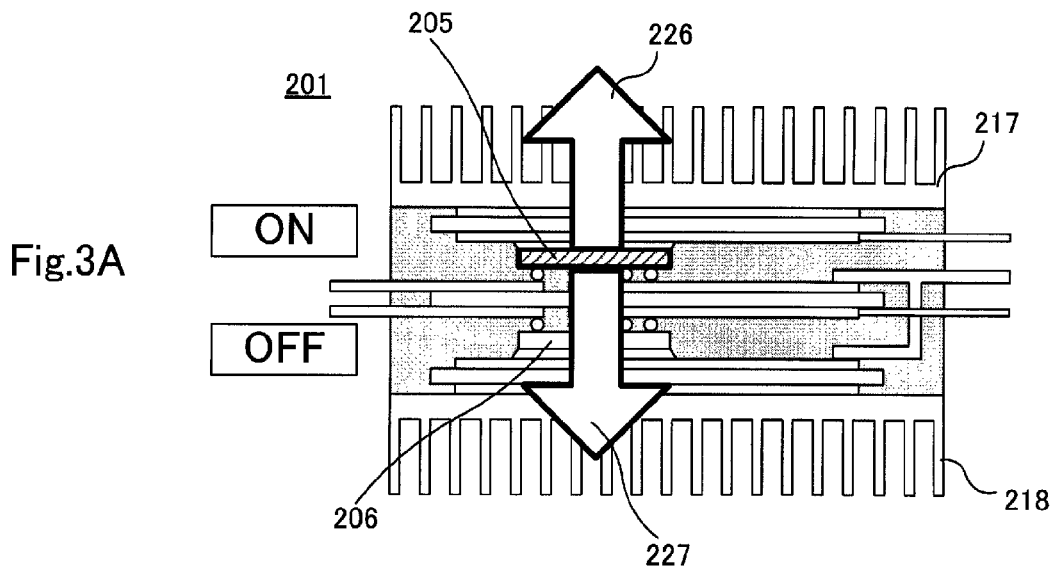
FIGS. 3A and 3B are a diagram schematically illustrating a time change of junction temperatures of a semiconductor device.

Here, in FIG. 3A, the first semiconductor device 205 and the second semiconductor device 206 are switched alternately via the metal wiring for gate signals 211, and are not turned on at the same time. When the first semiconductor device 205 is turned on, first radiation 226 flows toward the first heat sink 217, and second radiation 227 flows toward the second heat sink 218 via the second semiconductor device 206.

Figure 3B:
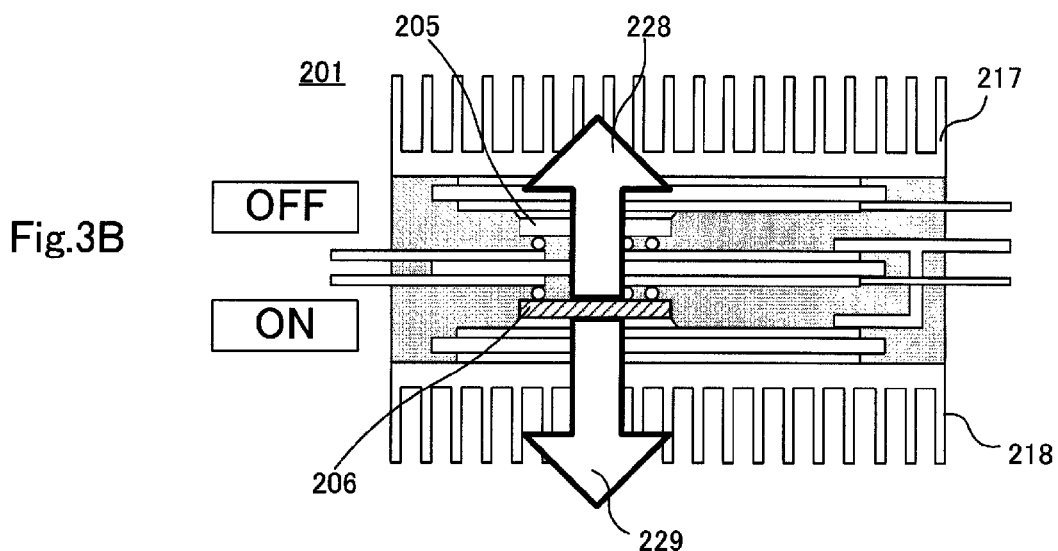

In FIG. 3B, when the second semiconductor device 206 is turned on, third radiation 228 generated by a freewheeling current flowing through a parasitic diode (not shown in the drawing) of the second semiconductor device 206 flows toward the first heat sink 217 via the first semiconductor device 205, and fourth radiation 229 flows toward the second heat sink 218.

Figure 4:
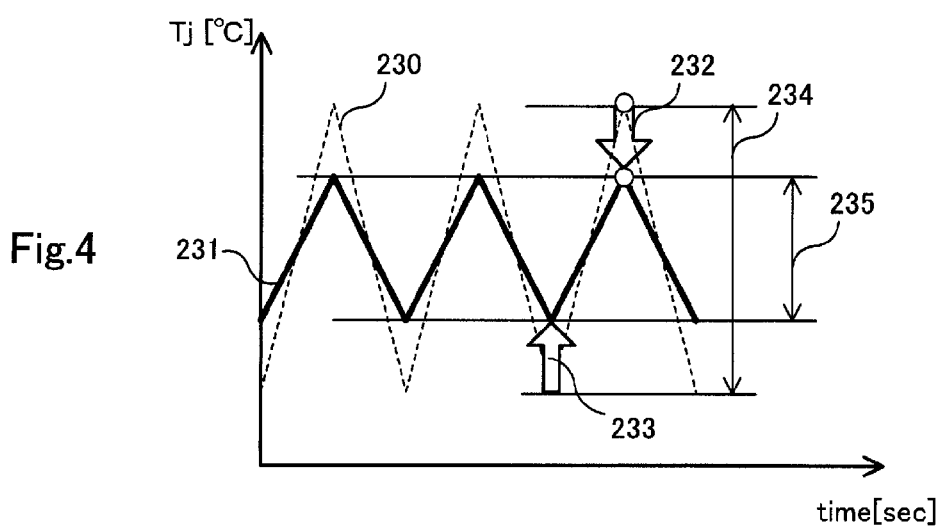
FIG. 4 is a graphical chart illustrating the change of the junction temperatures of the semiconductor device.

FIG. 4 shows a temperature change of the first semiconductor device 205. In FIG. 4, a temperature 230 indicated by a dotted line is a junction temperature of the semiconductor device when the first semiconductor device 205 radiates the heat only through one side. As the first radiation 226 and the second radiation 227 flow toward two directions respectively upward and downward when the first semiconductor device 205 generates the heat, a maximum junction temperature becomes lower than the case in which the heat is radiated only through one side by a temperature Ta (indicated by a numeral 232 in the figure).

Next, when the second semiconductor device 206 is turned on, a minimum junction temperature rises by a temperature Tb due to the third radiation 228 (indicated by a numeral 233 in the figure).

As a result, according to this embodiment, the junction temperatures of the semiconductor chip when the heat is radiated by the double side radiation is as shown by a thick line 231 in FIG. 4, and a heat cycle $\Delta Tja$ 234 when the heat is radiated only through one side is reduced down to a heat cycle $\Delta Tjb$ 235. Similarly, in the case of the second semiconductor device 206, the heat cycle becomes smaller than the heat cycle ΔTja 234 when the heat is radiated only through one side (the heat cycle ΔTjb 235).

Next, results of the simulation are described.

Figure 5:
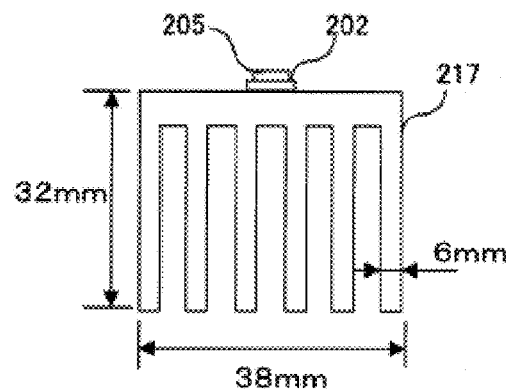
FIG. 5 is a schematic diagram of a power module that is used for a simulation of one side radiation.
Figure 6:
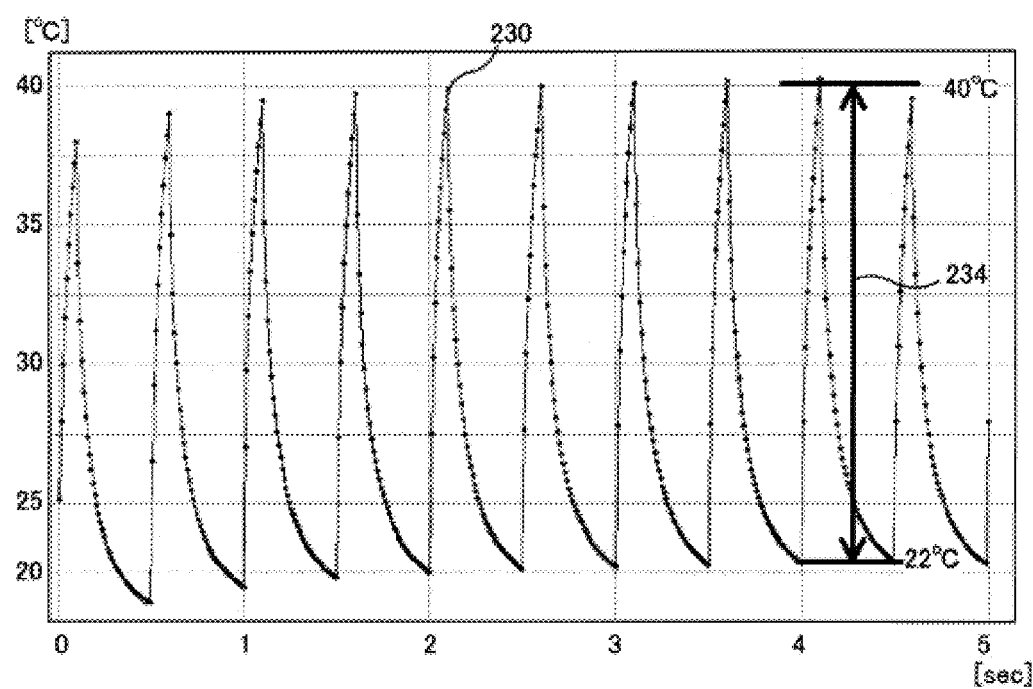
FIG. 6 is a diagram showing junction temperatures in a result of the simulation of the one side radiation.

First, a schematic diagram of a power module in which the first semiconductor device 205 was used for the simulation of one side radiation only with the first heat sink 217 is shown in FIG. 5, and the result of the simulation of the junction temperatures is shown in FIG. 6. Conditions for the simulation were as follow.

Loss: 20 W
Switching Time: on for 0.1 sec and off for 0.4 sec
Simulation Time: 5 sec
First Semiconductor Device 205: 5 mm×5 mm×0.2 mm
Insulated Circuit Board 202: 7 mm×7 mm×1.2 mm
First Heat Sink 217: Aluminum 38 mm×38 mm×32 mm (6 fins whose thickness is 3 mm)

The copper wiring and the resin member 216 on the insulated circuit board were not taken into account. Further, a temperature at a central portion of the first semiconductor 205 was taken as the junction temperature.

As a result, the junction temperatures were around 40 degrees C. at maximum and around 22 degrees C. at minimum, the heat cycle ΔTja (the numeral 234 in FIG. 6) in the one side radiation became 18 K.

Figure 7:
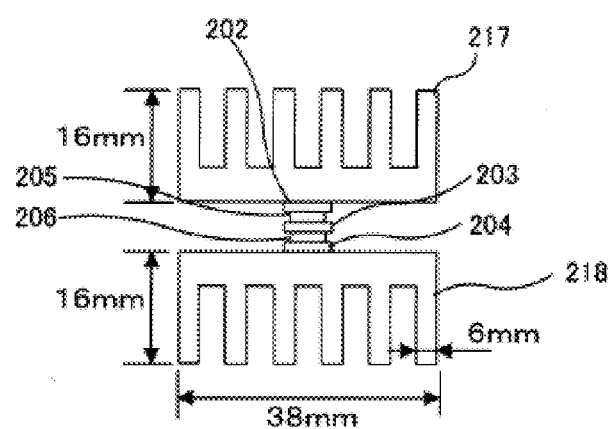
FIG. 7 is a schematic diagram of a power module that is used for a simulation of double side radiation according to this embodiment.
Figure 8:
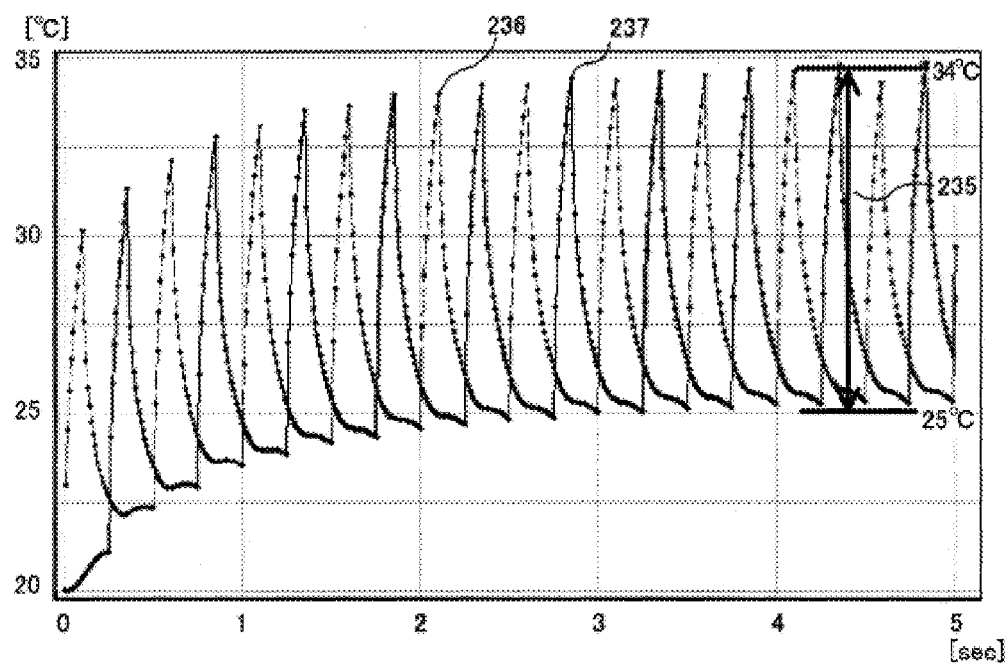
FIG. 8 is a diagram showing junction temperatures in a result of the simulation of the double side radiation.

On the other hand, a schematic diagram of a power module in which the first semiconductor device 205 was used for the simulation of double side radiation according to this embodiment is shown in FIG. 7, and the result of the simulation of the junction temperatures is shown in FIG. 8. Conditions for the simulation were as follow.

Loss: 20 W
Switching Time: on for 0.1 sec and off for 0.4 sec
Simulation Time: 5 sec
First Semiconductor Device 205: 5 mm×5 mm×0.2 mm
Second Semiconductor Device 206: 5 mm×5 mm×0.2 mm
Insulated Circuit Boards 202, 203, 204: 7 mm×7 mm×1.2 mm
First Heat Sink 217: Aluminum 38 mm×38 mm×16 mm (6 fins whose thickness is 3 mm)
Second Heat Sink 218: Aluminum 38 mm×38 mm×16 mm (6 fins whose thickness is 3 mm)

The copper wiring and the resin member 216 on the insulated circuit board were not taken into account. Further, temperatures at central portions of the first semiconductor 205 and the second semiconductor 206 were taken as the junction temperatures. Sizes of the first heat sink 217 and the second heat sink 218 were both set to be half of the heat sink used for the simulation shown in FIG. 5.

FIG. 8 shows a junction temperature change 236 due to the first semiconductor device 205 and a junction temperature change 237 due to the semiconductor device 206 of the second semiconductor plotted at the same time. In the simulation, a maximum junction temperature was 34 degrees C. and a minimum value was 25 degrees C., and the heat cycle ΔTja (the numeral 235 in FIG. 8) became 9 K.

Figure 9:
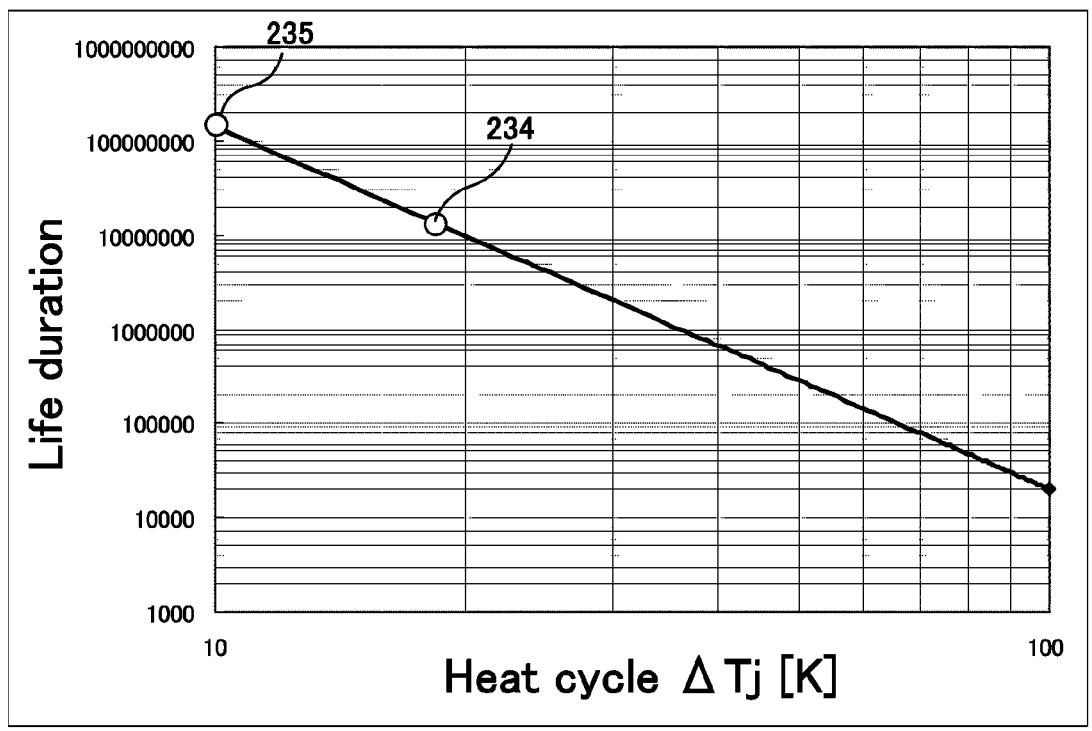
FIG. 9 is a diagram showing power cycle longevity of the power module.

Considering life duration in the one side radiation and in the double side radiation with reference to a power cycle longevity curve of the one-side radiating power module shown in FIG. 9, the life duration is about 15 million times in one side radiation and about 142 million times in double side radiation. Consequently, it can be estimated that the power cycle longevity is increased by about 10 times.

According to this embodiment, the semiconductor devices of the upper arm and the semiconductor devices of the lower arm are provided in a symmetrical manner centering the third substrate. Therefore, residual stresses applied to the upper surface and the lower surface of the third substrate are also symmetrical, increasing the power cycle longevity of the power as a result.

As described above, by symmetrically disposing the semiconductor devices configuring the upper arm of the inverter and the semiconductor devices configuring the lower arm of the inverter so as to face toward each other, that is, by thermally coupling the upper arm and the lower arm, the heat can be radiated through the both sides of the power module. Therefore, the maximum junction temperature can be reduced lower in comparison with the case in which the semiconductor device is cooled only with one side, thereby improving the life duration of the power module.

Applying such a power module described above to a motor control device can improve the power density of the motor control device. Further, more accurate control is demanded increasingly year by year regarding the motor control, and the heat cycle influences the reliability of the power module, making an influence on the reliability of the motor control device requiring accurate control more remarkable as a result.

Moreover, the minimum junction temperature can be increased by alternately switching the semiconductor devices of the upper and the lower arm, giving a part of the generated heat to the second semiconductor device 206 that is being turned off when the first semiconductor device 205 is turned on, and giving a part of the heat generated by the freewheeling current flowing through the parasitic diode of the semiconductor device 206 to the first semiconductor device 205 that is being turned off when the second semiconductor device 206 is turned on. As a result, it is possible to reduce a difference between the maximum junction temperature and the minimum junction temperature, i.e., the heat cycle ΔTj, and thus the power cycle longevity can be improved.

Furthermore, as the semiconductor devices of the upper arm and the semiconductor devices of the lower arm are disposed so as to face toward each other and thermally joined, a space for mounting can be reduced almost down to half. Further, as an area for connection to the semiconductor devices is increased as compared to connection using conventional wire bonding, it is advantageous in terms of the radiation.

Figure 10A:
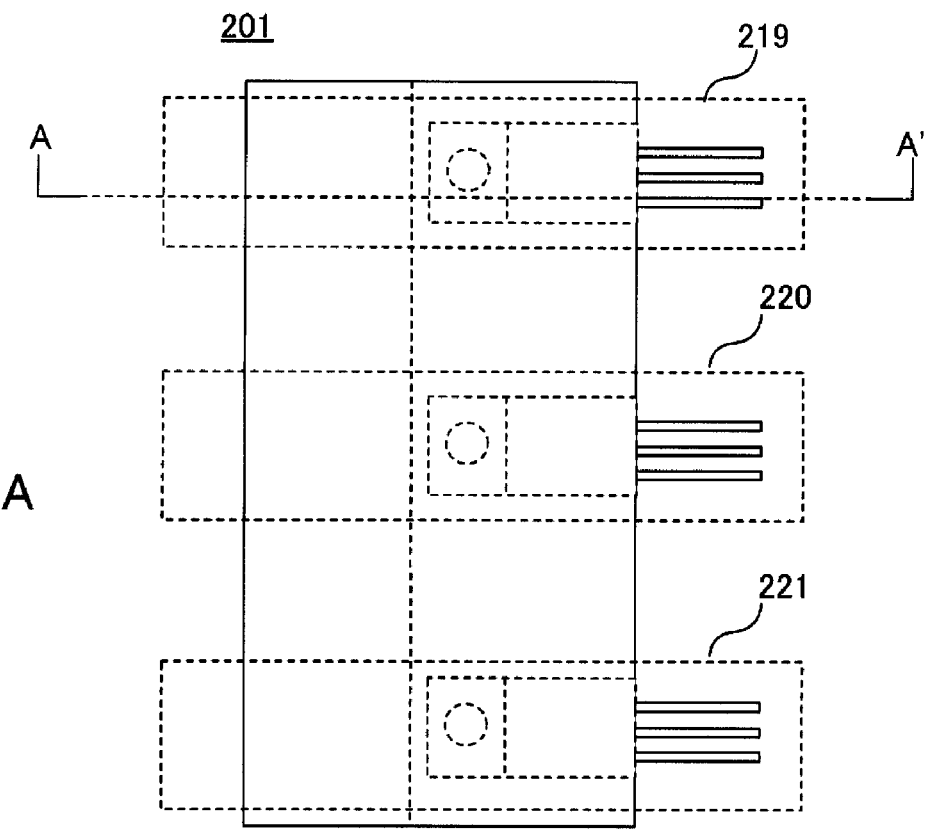
FIGS. 10A and 10B are a top view and a cross-sectional view of a power module of a different embodiment according to the present invention.
Figure 10B:
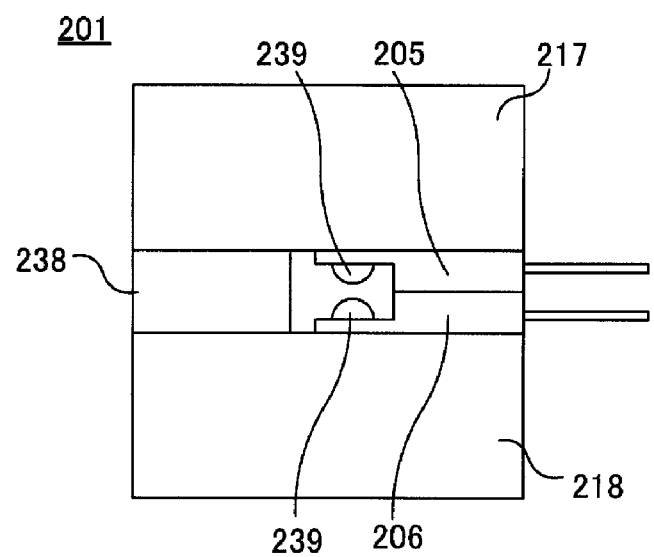

FIGS. 10A and 10B are a cross-sectional schematic diagram of a double-side radiating power module according to another embodiment. FIG. 10A is a top view of the double-side radiating module 201, illustrating areas in which upper and lower arms 219 in the U phase, upper and lower arms 220 in the V phase, and upper and lower arms 221 in the W phase are respectively formed.

FIG. 10B shows a cross-sectional view taken along line A-A' in FIG. 10A. FIG. 10B shows a cross-section of the first semiconductor device 205 and the second semiconductor device 206 of the upper and lower arms 219 in the U phase. The first semiconductor device 205 is thermally joined with a heat conductive grease or a heat conductive sheet (corresponding to the third substrate) interposed therebetween, and fixed to the first heat sink 217 using such as a fixing screw 239. The second semiconductor device 206 is similarly fixed to the second heat sink 218 using such as the fixing screw 239. A spacer 238 is dispose between the first heat sink 217 and the second heat sink 218.

By disposing the first semiconductor device 205 of the upper arm and the second semiconductor device 206 of the lower arm so as to face toward each other, and thermally joining the upper arm and the lower arm, the heat can be radiated through the both sides of the discrete semiconductor devices of the upper and lower arms. Accordingly, it is possible to lower the maximum junction temperature in comparison with the case of cooling the semiconductor chips through one side, thereby improving the life duration of the power module.

Moreover, the minimum junction temperature can be increased by alternately switching the semiconductor chips of the upper and the lower arm, giving a part of the generated heat to the second semiconductor device 206 that is being turned off when the first semiconductor device 205 is turned on, and giving a part of the generated heat to the first semiconductor device 205 that is being turned off when the second semiconductor device 206 is turned on. As a result, a difference between the maximum junction temperature and the minimum junction temperature, i.e., the heat cycle ΔTj, is reduced, and thus the power cycle longevity can be improved.

Furthermore, by disposing the upper and lower arms so as to face toward each other as described above, a space for mounting can be reduced almost down to half. In addition, a volume of the power module can be reduced almost down to half.

Further, as an area for connection to the semiconductor chips is increased as compared to connection using conventional wire bonding, it is advantageous in terms of the radiation.

Figure 11:
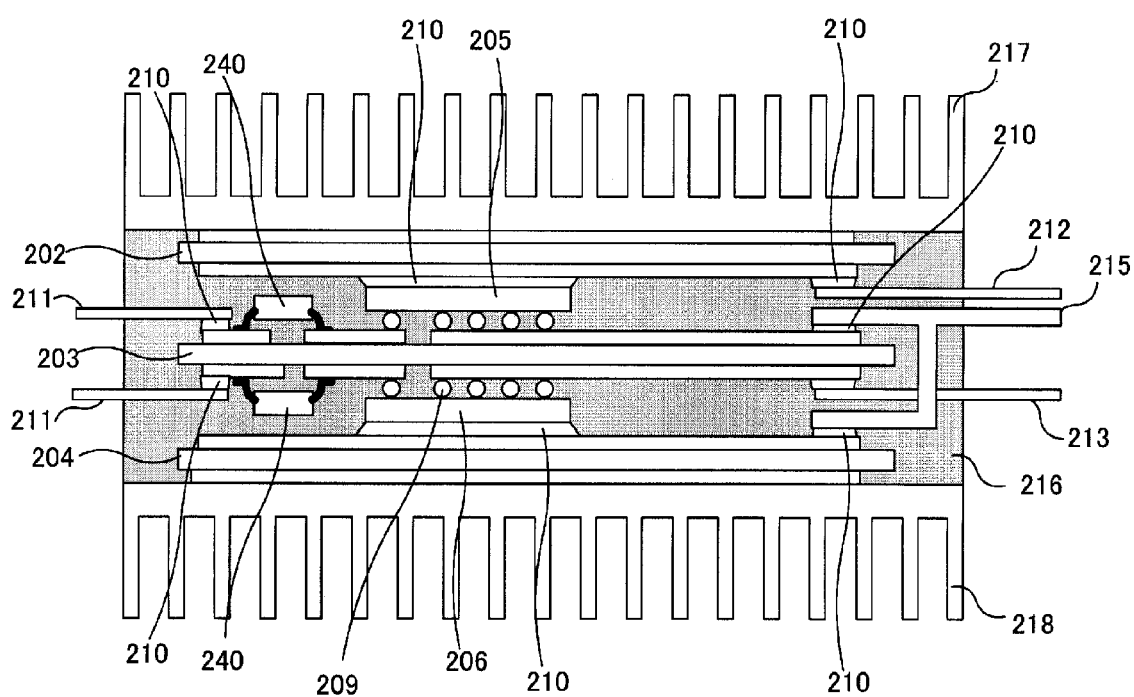
FIG. 11 is a cross-sectional view of a power module of another embodiment according to the present invention.

FIG. 11 is a cross-sectional schematic diagram of a double-side radiating power module according to another embodiment.

Referring to the figure, the power module 201 is provided with a gate driving element 240 that drives the MOSFET of each semiconductor device formed on the third substrate 203, in addition to the structure of the embodiment described above.

By disposing an electronic component such as a chip capacitor, a reactor, or a rectifier diode on the third substrate 203 in addition to the gate driving element 240, it is possible to shorten a wiring distance between the gate of the MOSFET and the gate driving element 240, thereby suppressing an abnormal operation generated by noises. Thus, a reverse bias of a gate voltage is not necessary, and it is possible to downsize the power circuit. This downsizing greatly contributes to downsizing and an improvement of the power density of the motor control device to which the double-side radiating power module of this type is applied.

According to this embodiment, for the first substrate 202, the second substrate 204, and the third substrate 203, a material such as alumina, silicone nitride, or aluminum nitride is used as an insulating material and a metal such as aluminum or copper is used as a wiring material. Such as a solder foil or a solder paste is used as the joining member 210.

The semiconductor devices according to this embodiment have been described taking an example of the MOSFET (field-effect transistor) having an antiparallel parasitic diode. However, the application of the present invention is not limited to this example, and the present invention is also applicable to an RC-IGBT, a bipolar transistor, and an IGBT having an antiparallel diode built-in.

Figure 12A:
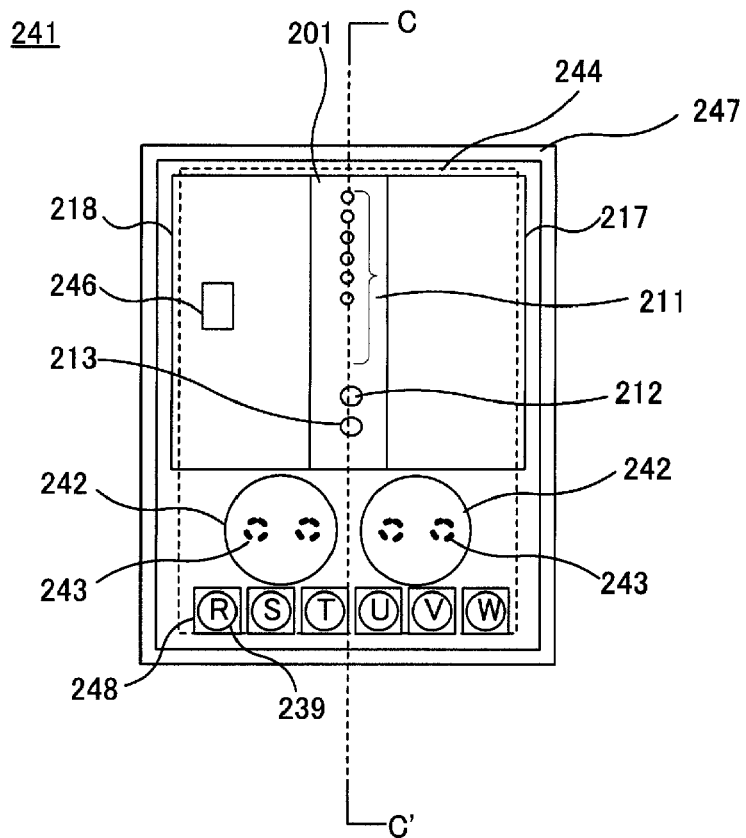
FIGS. 12A and 12B are a top view and a cross-sectional view of a motor control device on which the power module according to this embodiment is mounted.
Figure 12B:
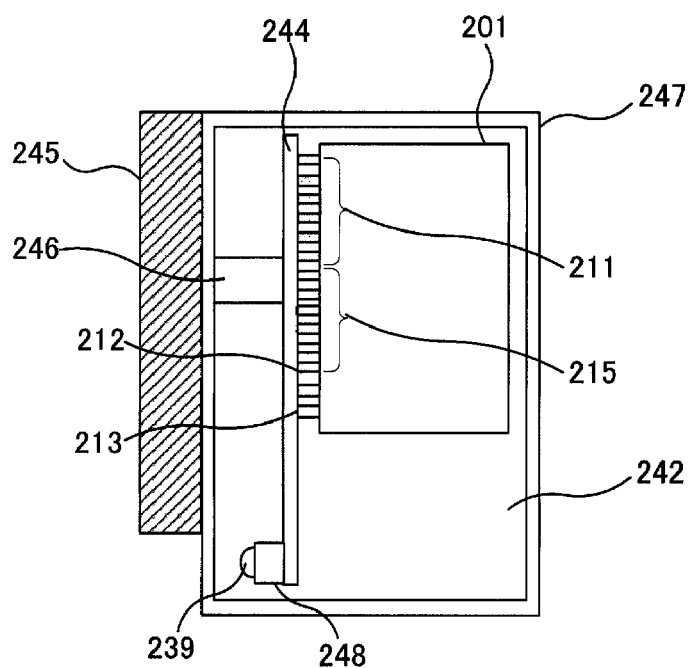

FIGS. 12A and 12B are a diagram for illustrating another embodiment. According to this embodiment, an example in which the double-side radiating power module is applied to the motor control device is shown.

Referring to FIG. 12A, the double-side radiating power module 201 according to the previous embodiment is applied to a motor control device 241 according to this embodiment. Further, the motor control device 241 is configured by the first heat sink 217, the second heat sink 218, the metal wiring for gate signals 211, the metal wiring for the P terminal 212, the metal wiring for the N terminal 213, a main circuit capacitor 242, a control circuit board 244, an external input/output terminal 246, and a casing 247.

FIG. 12B shows a cross-sectional view taken along line C-C' in FIG. 12A. The power module 201 is connected to the control circuit board 244 via the metal wiring 211, the busbar 215 for direct coupling to the semiconductors of the upper and lower arms also serving as the output terminal, the metal wiring for the P terminal 212, and the metal wiring for the N terminal 213. The power module 201 is connected to a power source and an electric motor via an input/output terminal that is configured by the fixing screws 239 and terminals 248 respectively of the U phase, the V phase, the W phase, an R phase, an S phase, and a T phase on the control circuit board 244. The terminals 248 respectively of the U phase, the V phase, the W phase, the R phase, the S phase, and the T phase are connected to the busbar 215 also serving as the output terminal of the power module 201 via wiring of the control circuit board 244 (not shown in the drawing).

The main circuit capacitor 242 is connected to the control circuit board 244 through a main circuit capacitor terminal 243, thereby being electrically connected to the metal wiring 212 and the metal wiring 213. The main circuit portion is thus configured, and contained within the casing 247. A controller 245 is attached to a surface of the casing 247 via a controller connecting terminal 246, thereby configuring the motor control device 241.

A coolant such as air passes though the main circuit capacitor 242, the first heat sink 217, and the second heat sink 218 from a lower surface of the casing 247, and then discharged through an upper surface of the casing 247.

Applying the present invention to the motor control device as described in this embodiment can improve the power density of the motor control device. Further, it is possible to realize a motor control device with increased power cycle longevity.

As more accurate control is demanded increasingly year by year regarding the motor control, the influence of the heat cycle ΔTj given to the reliability of the power module is large. According to the present invention, it is possible to reduce the heat cycle ΔTj, making the influence on the reliability of the motor control device requiring accurate control more remarkable as a result.

Further, it is possible to provide a fan for the lower surface or the upper surface of the casing to increase a flow amount of the coolant, thereby improving cooling efficiency.

Figure 13A:
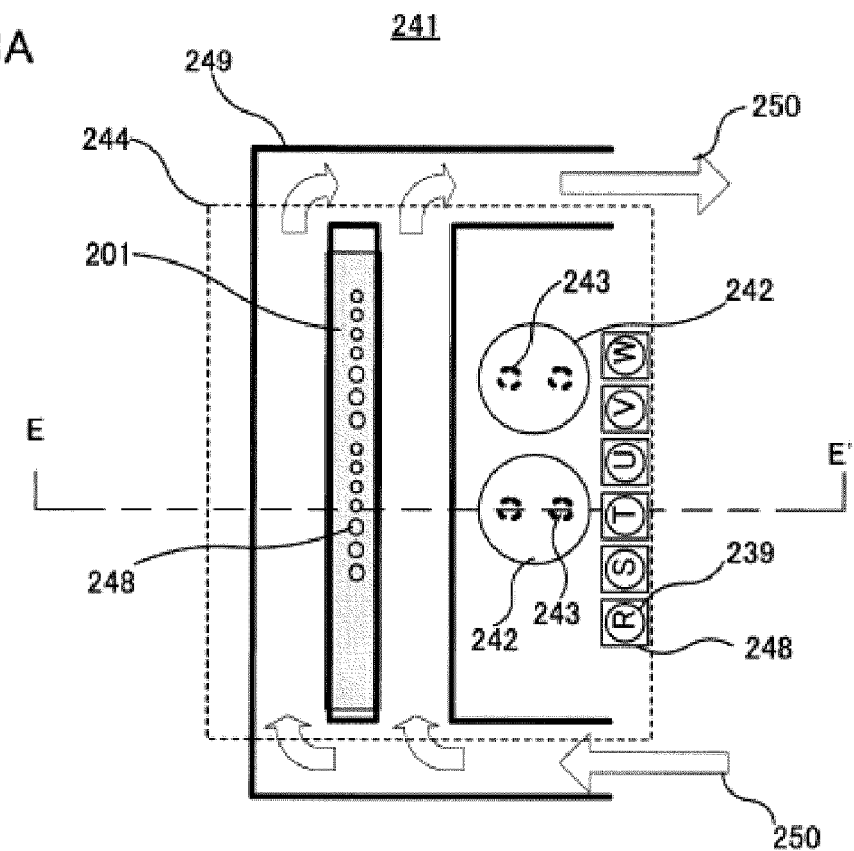
FIGS. 13A and 13B are a top view and a cross-sectional view of a water cooling structure of the motor control device on which the power module according to this embodiment is mounted.

FIG. 13A shows an example in which the double-side radiating power module 201 according to this embodiment is applied to a water-cooled motor control device. The power module 201 is disposed adjacent to a cooling tube through which a cooling fluid flows. According to this embodiment, water-cooling tubes 249 through which water flows are used as the cooling tubes. The motor control device 241 has a water cooling structure in which the double-side radiating power module 201 is sandwiched by the water-cooling tubes 249 from the both sides of the module. The control device 241 is electrically connected to the control circuit board 244 along with the main circuit capacitor 242, and is provided with the fixing screws 239 and the terminals 248 respectively of the U phase, the V phase, the W phase, the R phase, the S phase, and the T phase on the control circuit board 244. The control device 241 is connected to the power source and the electric motor via the terminals 248.

Figure 13B:
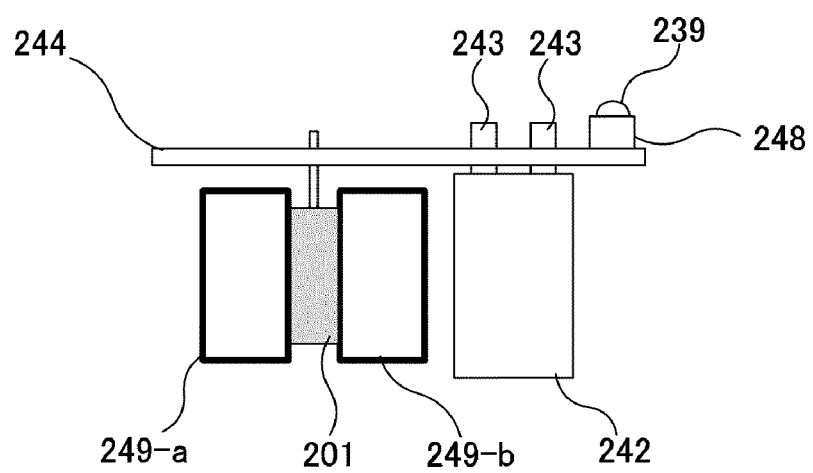

FIG. 13B shows a cross-sectional view taken along line E-E' in FIG. 13A. The double-side radiating power module 201 is sandwiched by the water-cooling tube 249-*a* and the water-cooling tube 249-*b* from the both sides of the module respectively with heat conductive greases or heat conductive sheets interposed therebetween. The heat from the semiconductor devices is absorbed to water flows 250 through the water-cooling tubes 249, and released outside through a radiator (not shown in the drawing) connected to the water-cooling tubes 249.

With the water cooling structure of the double-side radiating power module according to this embodiment, it is possible to simplify the water cooling structure and to downsize the motor control device as compared to a conventional double-side radiating power module and discrete type.

Figure 14A:
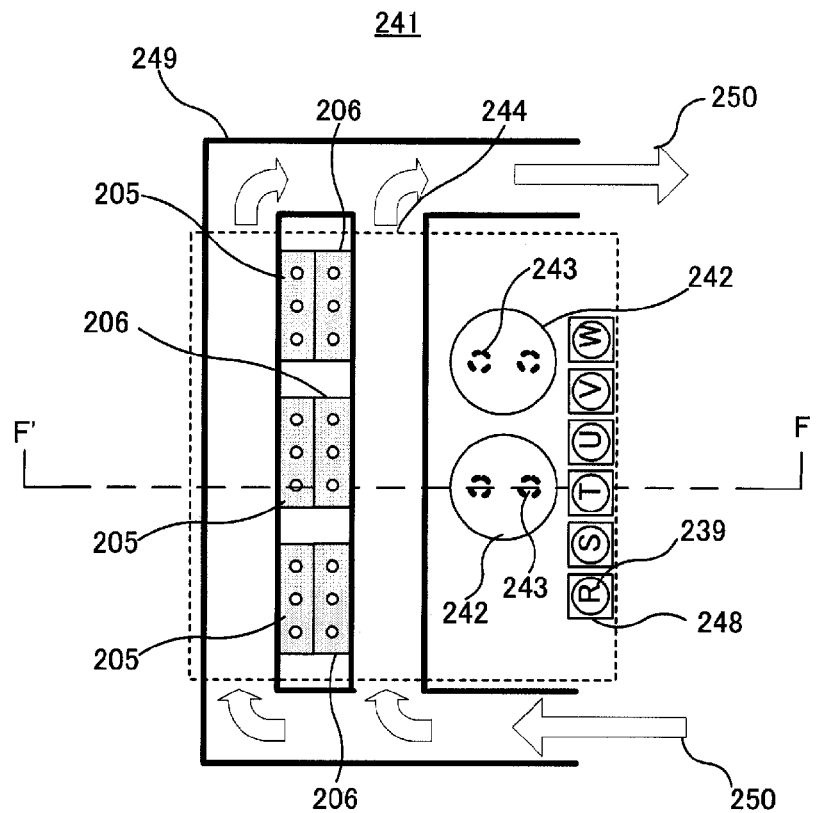
FIGS. 14A and 14B are a top view and a cross-sectional view of a water cooling structure of the motor control device on which the power module according to this embodiment is mounted.

On the other hand, FIG. 14A shows an example in which the power module of a different embodiment using a discrete semiconductor is applied to the water-cooled motor control device. The motor control device 241 of this example has a water cooling structure in which the water-cooling tubes 249 sandwich the first semiconductor device 205 and the second semiconductor device 206 of the upper and lower arms 219 in the U phase, the V phase, and the W phase. The control device 241 is electrically connected to the control circuit board 244 along with the main circuit capacitor 242, and is provided with the fixing screws 239 and the terminals 248 respectively of the U phase, the V phase, the W phase, the R phase, the S phase, and the T phase on the control circuit board 244. The control device 241 is connected to the power source and the electric motor via the terminals 248.

Figure 14B:
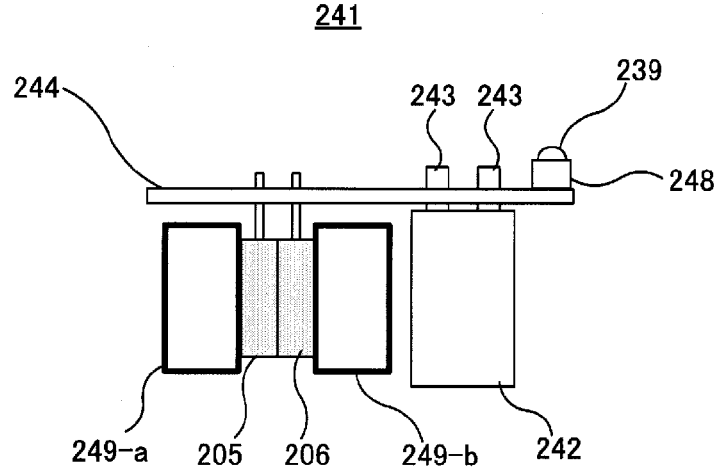

FIG. 14B shows a cross-sectional view taken along line F-F' in FIG. 14A. The first semiconductor 205 and the second semiconductor 206 are sandwiched by the water-cooling tube 249-*a* and the water-cooling tube 249-*b* by respectively applying the first semiconductor 205 and the second semiconductor 206 to the water-cooling tube 249-*a* and the water-cooling tube 249-*b* with the heat conductive greases or the heat conductive sheets interposed therebetween. The heat from the semiconductor devices is absorbed to the water flows 250 through the water-cooling tubes 249, and released outside through a radiator (not shown in the drawing) connected to the water-cooling tubes 249.

In this manner, with the water cooling structure of the double-side radiating power module according to this embodiment, it is also possible to simplify the water cooling structure and to downsize the motor control device as compared to a conventional double-side radiating power module and discrete type.

Although water is used as a coolant in this embodiment, the coolant is not limited to water as long as it is a cooling fluid.

Figure 15:
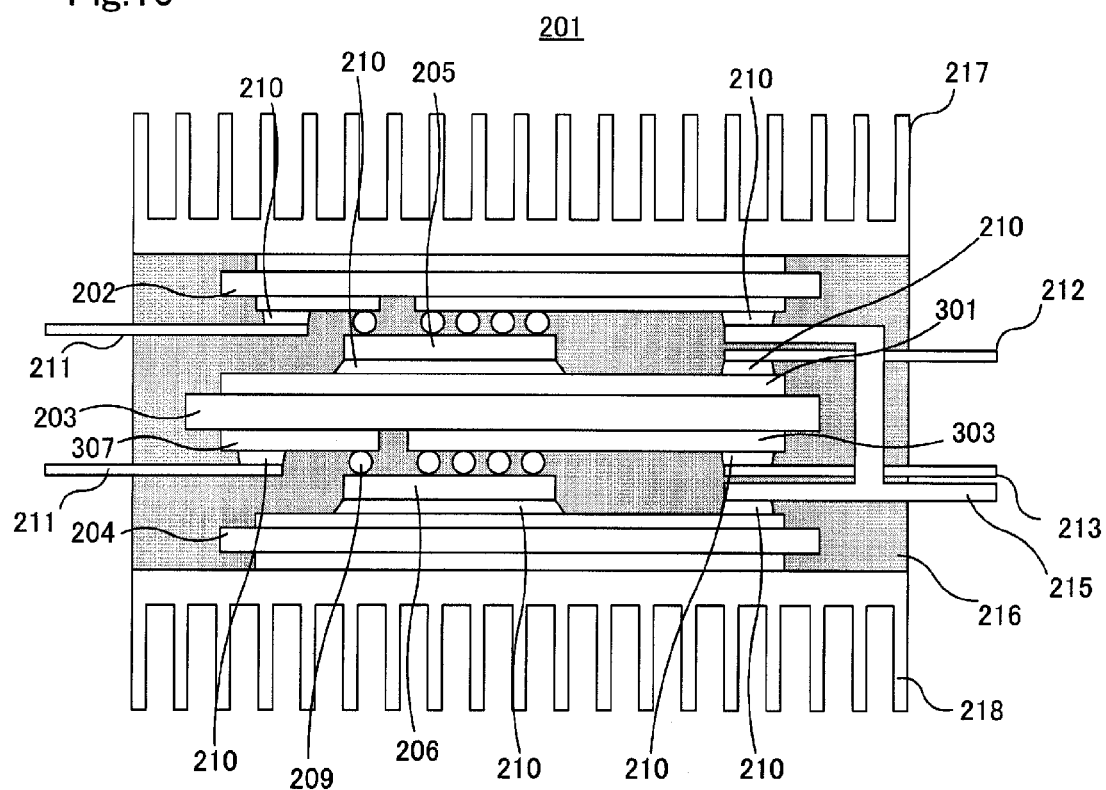
FIG. 15 is a cross-sectional view of a power module of yet another embodiment according to the present invention.

FIG. 15 shows a cross-sectional view of the power module 201 according to another embodiment that is provided with the features of the double-side radiating power module shown in FIG. 1 and capable of forming a main circuit capacitor within the power module. According to the power module 201 of this embodiment, similarly to the power module 201 of FIG. 1, it is possible to realize an advantageous effect of reducing ΔT.

The power module 201 is provided with the first substrate 202, the second substrate 204, the third substrate 203, the first semiconductor device 205, and the second semiconductor device 206. The first semiconductor device 205 is disposed over the third substrate 203 with the joining member 210 interposed therebetween, and fixed onto the third substrate 203. Similarly, the second semiconductor device 206 is disposed over the second substrate 204 with the joining member 210 interposed therebetween, and fixed onto the second substrate 204.

The third substrate 203 is provided between the first semiconductor device 205 and the second semiconductor device 206. As the third substrate 203, an insulated circuit board where a P terminal metallic plate 301, an N terminal metallic plate 303, and a gate terminal metallic plate 307 are formed on a surface and electrical wiring is formed in an interior thereof is used. Further, the metal wiring for the P terminal 212 and the metal wiring for the N terminal 213 are disposed over the third substrate 203 with the joining member 210 interposed therebetween, and at symmetrical positions with the third substrate 203 interposed therebetween. As the first substrate 202 and the second substrate 204, insulated substrates are used. It is desirable that these insulated substrates are made of a material having high exoergic property.

The power module 201 is further provided with the soldering balls 209 that electrically connect the first semiconductor device 205 with the wiring disposed over the first substrate 202. This also applies to the second semiconductor device 206 and the third substrate 203. According to this embodiment, the soldering balls 209 whose main component is soldering are used. However, the soldering balls 209 can be conductive members made of any material and into any shape as long as the devices and the wiring can be electrically connected. The wiring formed on or within the third substrate 203 will not be described in detail for the sake of simplicity of explanation.

According to this embodiment, in order to cause the power module 201 to function as an inverter, the power module 201 is further provided with the metal wiring for gate signals 211, the metal wiring for the P terminal 212, the metal wiring for the N terminal 213, and the busbar 215 for direct coupling to semiconductors of upper and lower arms also serving as an output terminal, and sealed by the resin member 216 using a well-known method of sealing as shown in FIG. 15. Further, the first heat sink 217 is formed on a back surface of the first substrate 202 via fixing means such as an adhesive material, and the second heat sink 218 is formed on a back surface of the second substrate 204 similarly via the fixing means such as an adhesive material.

The third substrate 203 is joined to the metal wiring for the P terminal 212 to its upper surface and the metal wiring for the N terminal 213 to its back surface with the joining members 210 interposed therebetween. The substrate 204 between the metal wiring for the P terminal 212 and the metal wiring for the N terminal 213 is able to constitute an accumulation element in order to fix and insulate the terminals, and working in place of the main circuit capacitor by charges being accumulated between the metal wiring for the P terminal 212 and the metal wiring for the N terminal 213 by using a dielectric material as a material of the substrate.

Further, the third substrate 203 is not particularly limited as long as it is made of an insulating material such as aluminum nitride (AlN), alumina (Al2O3), or beryllia (BeO).

The first to sixth MOSFETs thus constitute a three-phase inverter circuit. The three-phase inverter circuits have been described for the power module 201 of FIG. 1, and therefore will not be repeated here.

According to this embodiment, the description is given assuming that the first to sixth semiconductor devices are separately formed. In this case, the first, third, and fifth semiconductor devices, i.e., the upper arm, and the second, fourth, and sixth semiconductor devices, i.e., the lower arm are disposed at equivalent positions centering the third substrate 203. In addition, it is desirable that the wiring patterns and such in the respective semiconductor devices are substantially the same as long as physically possible. With this, configurations of the devices of the upper arm and the devices of the lower arm become equivalent with the third substrate 203 interposed therebetween, thereby efficient radiation can be expected.

Here, when the first, third, and fifth semiconductor devices are formed within the single semiconductor device 205 that is formed on the third substrate 203, and the second, fourth, and sixth semiconductor devices are formed within the single semiconductor device 206 that is formed on the second substrate 204, these semiconductor devices 205 and 206 are disposed at equivalent positions by stacking the first substrate 202, the third substrate 203, and the second substrate 204 in the stated order, thereby the upper arm and lower arm are disposed at equivalent positions. Further, it is desirable that the wiring patterns and such in the respective semiconductor devices are substantially the same as long as physically possible. The following description is given assuming that the first, third, and fifth semiconductor devices are formed within the single semiconductor device 205 that is formed on the third substrate 203, and the second, fourth, and sixth semiconductor devices are formed within the single semiconductor device 206 that is formed on the second substrate 204, for the sake of simplicity of explanation.

Similarly to the embodiment shown in FIG. 1, by disposing the semiconductor devices that constitute the upper arm and the semiconductor devices that constitute the lower arm of the inverter circuit at symmetrical positions with an insulating member such as the third substrate interposed therebetween, the heat generated from the semiconductor devices can be efficiently radiated through the both sides of the power module. With this, it is possible to reduce a thermal resistance and a junction temperature. As it is further possible to reduce the heat cycle ΔTj, a highly reliable power module with longer life duration and reduced heat cycle can be realized.

Further, by making the wiring patterns in the respective semiconductor devices and other components on the first substrate and the second substrate substantially the same as long as physically possible, the upper arm and the lower arm are disposed in a symmetrical manner with the third substrate interposed therebetween. Therefore, the heat generated from the semiconductor devices can be efficiently radiated through an upper and a lower surface of the power module.

Figure 16:
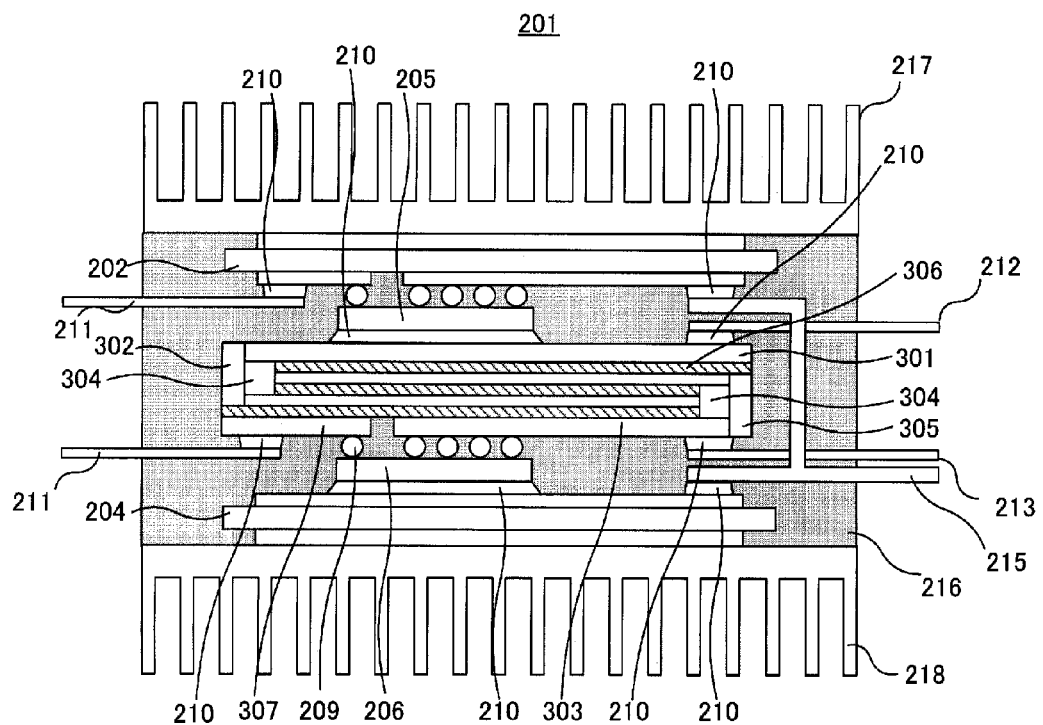
FIG. 16 is a cross-sectional view of a power module of yet another embodiment according to the present invention.

FIG. 16 shows a cross-sectional view of the power module 201 of yet another embodiment. According to this embodiment, the power module for increasing an amount of charge accumulated in the third substrate 203 is explained.

Figure 17:
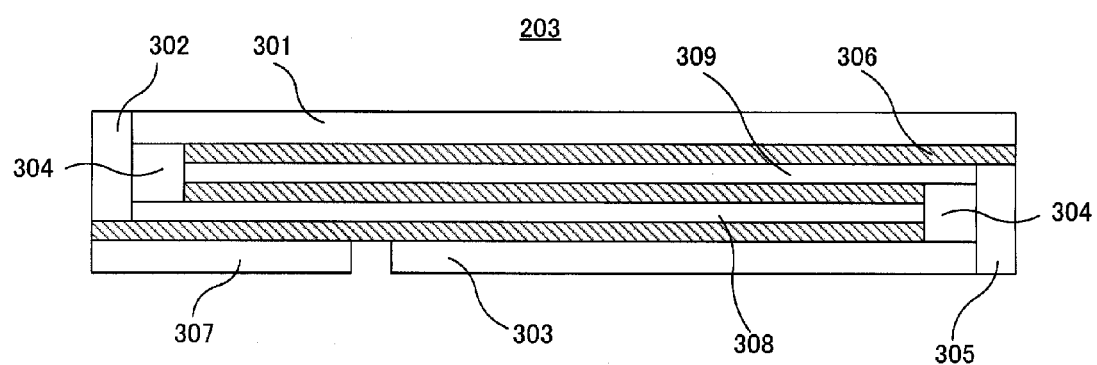
FIG. 17 is a cross-sectional view of an insulated circuit board having a function of a main circuit capacitor.

The power module 201 shown in FIG. 16 has the same structure as the power module 201 shown in FIG. 15 other than the third substrate 203. FIG. 17 shows a structural diagram of the third substrate 203 according to this embodiment.

The third substrate 203 of FIG. 17 is provided with the P terminal metallic plate 301, the N terminal metallic plate 303, the gate signal metallic plate 307 electrically connected to the second semiconductor device 206 shown in FIG. 16 with the soldering balls 209, a first insulating material 304 that insulates a P potential and an N potential, and a second insulating material 306 having a high dielectric constant that insulates a P terminal metallic plate 305, the N terminal metallic plate 303, a P terminal metallic inner layer plate 308, or an N terminal metallic inner layer plate 309. The first semiconductor device 205 is connected to the P terminal metallic plate 301 with the joining member 210 interposed therebetween. The N terminal metallic plate 303 is electrically joined to the second semiconductor device 206 with the soldering balls 209.

Further, the gate terminal metallic plate 307 is electrically joined to the second semiconductor device 206 with the soldering balls 209. The gate terminal metallic plate 307 is disposed laterally with an insulation distance from the N terminal metallic plate 303.

The P terminal metallic plate 301 and the P terminal metallic inner layer plate 308 are joined with a P terminal metallic side plate 302 and a wax member interposed therebetween. Similarly, the N terminal metallic plate 303 and the N terminal metallic inner layer plate 309 are joined with the N terminal metallic side plate 305 and the wax member interposed therebetween (not shown in FIG. 16 and FIG. 17).

Further, the second insulating material 306 is not particularly limited as long as it is made of an insulating material such as aluminum nitride (AlN), alumina (Al2O3), or beryllia (BeO).

The thickness of the second insulating material 306 can be such that the insulation distance between the P potential and the N potential is maintained and the insulation can be realized. As a thinner insulating material can accumulate a greater amount of charge, it is desirable that the thickness of the insulating material is minimum.

The P terminal metallic plate 301 and the N terminal metallic plate 303 are respectively disposed above and below the third substrate 203 shown in FIG. 17, and the second insulating material 306 whose dielectric constant is high are disposed alternately overlapping on each other between the P terminal metallic inner layer plate 308 and the N terminal metallic inner layer plate 309. Such as the wax member is used for joining the P terminal metallic plate 301, the N terminal metallic plate 303, the gate terminal metallic plate 307, the P terminal metallic inner layer plate 308, or the N terminal metallic inner layer plate 309 with the second insulating material 306.

Further, the joining member is not limited to the wax member as long as it can join a metallic plate with an insulating material.

Moreover, the P terminal metallic side plate 302 and N terminal metal 309 are insulated by the first insulating material 304. Similarly, the N terminal metallic side plate 305 and the P terminal metal 308 are also insulated by the first insulating material 304. The first insulating material 304 is not particularly limited as long as it is made of an insulating material such as aluminum nitride (AlN), alumina (Al2O3), or beryllia (BeO).

Here, the manufacturing method according to this embodiment is described with reference to FIG. 17. However, the description is given only to a portion of the third substrate 203.

The first semiconductor device 205 is stacked over a semiconductor device attachment surface of a metal wiring surface of the third substrate 203 with the joining member 210 and a solder foil interposed therebetween. The metal wiring for the P terminal 212 and the metal wiring for the N terminal 213 are stacked over with the joining member 210 interposed therebetween. Subsequently, the joining member 210 is melted and hardened by reflowing using a heater, thereby forming an upper portion. Similarly, the metal wiring for the N terminal 213, the gate terminal metallic plate 307, and the metal wiring for gate signals 211 are joined to the N terminal metallic plate 303 of the semiconductor device attachment surface of the metal wiring surface of the third substrate 203 with the joining member 210 interposed therebetween, thereby forming a lower portion. Moreover, the metal wiring for the P terminal 212 and the metal wiring for the N terminal 213 are disposed substantially symmetrical with the third substrate 203 interposed therebetween.

Next, the N terminal metallic plate 303 and the gate signal metallic plate 307 are disposed laterally with an insulation distance therebetween, and the second insulating material 306 is disposed over the N terminal metallic plate 303 and the gate terminal metallic plate 307 to join the N terminal metallic plate 303 and the gate terminal metallic plate 307 with the wax member. The second insulating material 306 is shortened by a length for disposing the first insulating material 304 in order to maintain the insulation between the P terminal metallic inner layer plate 308 and the N terminal metallic side plate 305.

The wax member is used for joining the metallic plate and the insulating material, but the joining member is not limited to the wax member as long as it can join the metallic plate with the insulating material.

Next, the P terminal metallic inner layer plate 308 is disposed over the second insulating material 306, and spaces for disposing the first insulating material 304 and the P terminal metallic side plate 302 on the both sides as shown in FIG. 17 are maintained and the length is determined.

Then, the second insulating material 306 is similarly disposed over the P terminal metallic inner layer plate 308, and joined with the wax member. Here, the space is maintained to insulate between the P terminal metallic inner layer plate 308 and the N terminal metallic side plate 305, and the first insulating material 304 is disposed in this space.

Next, the N terminal metallic inner layer plate 309 and the second insulating material 306 are disposed in the stated order, and after joining using the wax member, the first insulating material 304 is disposed in the space maintained to insulate between the N terminal metallic inner layer plate 309 and the P terminal metallic side plate 302. The P terminal metallic plate 301 to which the first semiconductor device 205 is connected is disposed over the second insulating material 306, and joined with the wax member.

Finally, the P terminal metallic plate 301, the P terminal metallic inner layer plate 308, and the P terminal metallic side plate 302 are joined with the wax members. Similarly, the N terminal metallic plate 303, the N terminal metallic inner layer plate 309, and the N terminal metallic side plate 305 are also joined with the wax members. Thus, the third substrate 203 is formed.

It is possible to stack any number of the second insulating material 306, the P terminal metallic inner layer plate 308, and the N terminal metallic inner layer plate 309 that are stacked in this manner. By stacking any desired number, it is possible to increase the amount of charge that can be accumulated, and to realize a downsized power module with longer life duration as an inverter or a servo amplifier.

Figure 18:
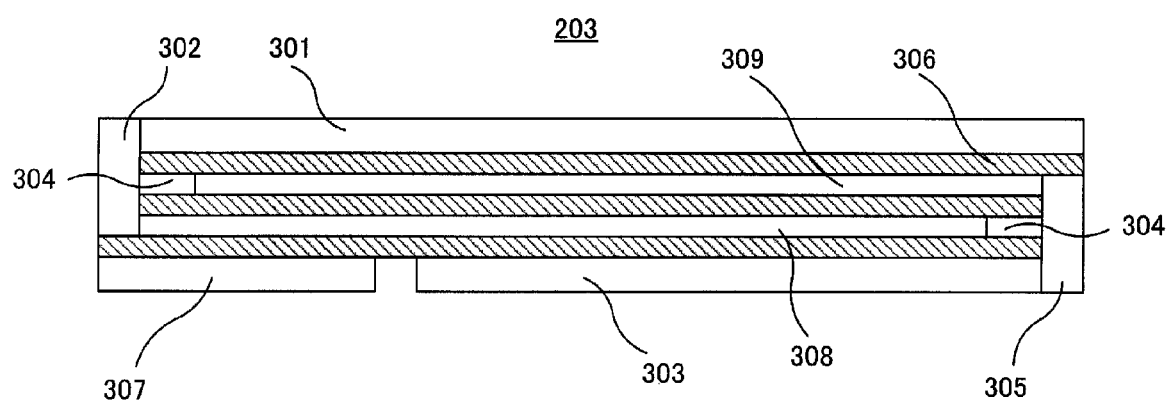
FIG. 18 is a cross-sectional view of an insulated circuit board having the function of the main circuit capacitor according to further another embodiment according to the present invention.

In the third substrate 203 shown in FIG. 18, by decreasing an area of the first insulating material 304 of the third substrate 203 shown in FIG. 17 and increasing an area of the second insulating material 306, it is possible to accumulate the greater amount of charge as well as to simplify manufacturing steps. The basic manufacturing method is substantially the same.

According to the third substrate 203 shown in FIG. 18, the manufacturing steps are simplified by modifying an internal structure of the third substrate 203 shown in FIG. 17. The manufacturing method should be understood with reference to the above description. In the example shown in FIG. 17, the first insulating material 304 insulates the P potential and the N potential using a thickness corresponding to three layers of the second insulating material 306, the P terminal metallic inner layer plate 308 or the N terminal metallic inner layer plate 309, and the second insulating material 304. However, in the example shown in FIG. 18, the first insulating material 304 is disposed with a thickness corresponding only to a single layer of the P terminal metallic inner layer plate 308 or the N terminal metallic inner layer plate 309, and a greater amount of the second insulating material 306 is stacked. With this, as compared to the power module 201 shown in FIG. 17, the example shown in FIG. 18 can accumulate an increased amount of charge in the third substrate 203 with the same geometry.

According to the above embodiment, it is possible to reduce a thermal resistance and a junction temperature by radiating the heat generated from the semiconductor devices through the both sides of the power module. As it is further possible to reduce the heat cycle $\Delta Tj$, a highly reliable power module with longer life duration and reduced heat cycle can be realized.

Further, according to the above embodiment, it is possible to provide the three-phase inverter used for the motor control device in which the influence of the heat cycle $\Delta Tj$ given to the reliability of the power module is large. Further, more accurate control is demanded increasingly year by year regarding the motor control, and the heat cycle $\Delta Tj$ influences the reliability of the power module, making an influence on the reliability of the motor control device requiring accurate control more remarkable as a result.

Moreover, according to the above embodiment, the parasitic diode formed in the FET can be used as the freewheeling diode, and therefore it is possible to realize a further downsized power module.

Furthermore, according to the above embodiment, the device that drives the FET can be disposed close to the FET, the wiring distance between these components can be decreased. As a result, it is possible to reduce wiring noises.

Further, according to the above embodiment, it is possible to further accelerate the radiation effect of the power module.

Moreover, according to the above embodiment, it is possible to improve the power density of the motor control device. Further, as described above, more accurate control is demanded increasingly year by year regarding the motor control, and the heat cycle $\Delta Tj$ influences the reliability of the power module, making an influence on the reliability of the motor control device requiring accurate control more remarkable as a result.

Furthermore, according to the above embodiment, the power density of the motor control device can be improved, and it is possible to realize a motor control device with increased power cycle longevity.

Further, according to the above embodiment, the first semiconductor device and the second semiconductor device are disposed at symmetrical positions with the third substrate interposed between. Therefore, by turning one FET off while the other is turned on, the heat generated from the FET that is being turned on is efficiently radiated to the side of the substrate on which the FET that is being turned off is mounted.

Moreover, according to the above embodiment, the heat generated from the FETs are radiated through both sides of the substrate, and it is possible to realize a power module with the reduced difference between the minimum temperature and the maximum temperature of the heat junction temperatures, that is, the heat cycle $\Delta Tj$.

According to the invention of claim 11, in addition to the effect obtained by the inventions of claims 2 to 4, by turning one FET on while the other is turned off, the heat generated from the FET that is being turned on is efficiently radiated to the side of the substrate on which the FET that is being turned off is mounted.

Moreover, according to the above embodiment, the heat generated from the FETs are radiated through both sides of the substrate, and it is possible to realize a power module with the reduced difference between the minimum temperature and the maximum temperature of the heat junction temperatures, that is, the heat cycle $\Delta Tj$.

Furthermore, according to the above embodiment, the FET that constitutes the upper arm and the FET that constitutes the lower arm are disposed symmetrically to each other with the substrate interposed therebetween. Therefore, by turning one FET on while the other is turned off, the heat generated from the FET that is being turned on is efficiently radiated to the side of the substrate on which the FET that is being turned off is mounted.

Further, according to the above embodiment, it is possible to reduce the thermal resistance and the junction temperature by radiating the heat generated from the semiconductor devices through the both sides of the power module with the semiconductor device using SiC or GaN whose junction temperature becomes higher than that of a semiconductor device using Si. As it is further possible to reduce the heat cycle $\Delta Tj$, a highly reliable power module with longer life duration and reduced heat cycle can be realized.

Moreover, according to the above embodiment, the power density can be improved, and it is possible to realize a motor control device with increased power cycle longevity.

Furthermore, according to the above embodiment, it is possible to reduce the thermal resistance and the junction temperature by radiating the heat generated from the semiconductor devices through the both sides of the power module. As it is further possible to reduce the heat cycle $\Delta Tj$, a highly reliable power module with longer life duration and reduced heat cycle can be realized.

Further, according to the above embodiment, it is possible to accumulate a charge in the third substrate that is equivalent to that of the main circuit capacitor. Therefore, it is possible to reduce ripples and to suppress a rise of a voltage between the main circuits in regeneration, thereby stabilizing the voltage between the main circuits. In addition, it is possible to downsize electrolytic capacitors in the main circuits outside the power module.

Moreover, according to the above embodiment, it is possible to accumulate a greater amount of charge between the main circuits by increasing the number of dielectric material layers in the third substrate. Therefore, it is possible to eliminate the necessity of the electrolytic capacitors in the main circuits outside the power module, thereby downsizing a size of and increasing the life duration of an entire system of an inverter or a servo amplifier.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. A power semiconductor module comprising:
    a first semiconductor device provided with a first FET;
    a first substrate on a surface of which the first semiconductor device is disposed;
    a second semiconductor device provided with a second FET;
    a connection line electrically connecting the first FET with the second FET in series;
    a second substrate on a surface of which the second semiconductor device is disposed;
    a first terminal;
    a second terminal; and
    a third substrate disposed between the first semiconductor device on the first substrate and the second semiconductor device on the second substrate, the third substrate being electrically connected in parallel to the first FET and the second FET and being configured to accumulate a charge between the first terminal and the second terminal, the first semiconductor device and the second semiconductor device being disposed at symmetrical positions with third substrate interposed therebetween, the third substrate comprising:
        a first metallic plate electrically connecting the first FET of the first semiconductor device to the first terminal;
        a second metallic plate provided to face the first metallic plate and electrically connecting the second FET of the second semiconductor device to the second terminal;
        a first metallic layer provided between the first metallic plate and the second metallic plate and electrically connected with the first metallic plate to accumulate a charge between the first terminal and the second terminal;
        a second metallic layer provided between the first metallic plate and the first metallic layer and electrically connected with the second metallic plate to accumulate a charge between the first terminal and the second terminal; and
        a plurality of insulation layers provided between the first metallic plate and the second metallic plate to prevent the first and second terminals from being electrically connected with each other through the third substrate.

2. The power semiconductor module according to claim 1, further comprising:
    a first inverter circuit provided with the first FET, the second FET, and a first connection line including a first connection node electrically connecting the first FET with the second FET;
    a second inverter circuit provided with a third FET formed within a third semiconductor device disposed on the first substrate, and a fourth FET formed within a fourth semiconductor device disposed on the second substrate, and a second connection node electrically connecting the third FET, with the fourth FET in series; and
    a third inverter circuit provided with a fifth FET formed within a fifth semiconductor device disposed on the first substrate, a sixth FET formed within a sixth semiconductor device disposed on the second substrate, and a third connection node electrically connecting the fifth FET with the sixth FET in series, wherein
    the first to third connection nodes are connected to an output terminal.

3. The power semiconductor module according to claim 2, wherein
    the first to sixth FETs are respectively provided with parasitic diodes.

4. The power semiconductor module according to claim 3, wherein
    on the third substrate, elements for driving the first to sixth FETs are mounted.

5. The power semiconductor module according to claim 4, further comprising:
    a first heat sink formed on a back surface facing away of the surface of the first substrate; and
    a second heat sink formed on a back surface facing away of the surface of the second substrate.

6. A control device for a motor that controls the motor using the power semiconductor module according to claim 5.

7. The control device for a motor according to claim 6, wherein
    the power semiconductor module is disposed adjacent to a cooling tube through which a cooling fluid flows.

8. The control device for a motor according to claim 7, wherein
the cooling tube is provided with a first cooling unit and a second cooling unit, and
the power semiconductor module is disposed between the first cooling unit and the second cooling unit.

9. A method of controlling the power semiconductor module according to claim 1, comprising:
a first step in which the second FET is substantially in an off state when the first FET is turned on; and
a second step in which the first FET is substantially in an off state when the second FET is turned on.

10. The method of controlling a power semiconductor module according to claim 9, wherein
the first step and the second step are alternately repeated.

11. The power semiconductor module according to claim 1, wherein
the first metallic layer is thinner than the first metallic plate, and
the second metallic layer is thinner than the second metallic plate.

12. The power semiconductor module according to claim 1, wherein
the plurality of insulation layers include a first insulation layer and a second insulation layer,
the first insulation layer is provided between the first metallic plate and the second metallic layer to prevent the first and second terminals from being electrically connected with each other through the third substrate, and
the second insulation layer is provided between the second metallic plate and the first metallic layer to prevent the first and second terminals from being electrically connected with each other through the third substrate.

13. The power semiconductor module according to claim 12, wherein
the plurality of insulation layers further include a third insulation layer provided between the first and second metallic layers to prevent the first and second terminals from being electrically connected with each other through the third substrate.

14. The power semiconductor module according to claim 13, wherein
the first to third insulation layers are thinner than at least one of the first and second metallic plates.

15. The power semiconductor module according to claim 13, wherein the third substrate further comprises
a first metallic connecting member electrically connecting the first metallic plate to the first metallic layer, and
a second metallic connecting member electrically connecting the second metallic plate to the second metallic layer.

16. The power semiconductor module according to claim 15, wherein the third substrate further comprises
a first insulation member provided between the first metallic connecting member and an edge of the second metallic layer to prevent the first and second terminals from being electrically connected with each other through the third substrate, and
a second insulation member provided between the second metallic connecting member and an edge of the first metallic layer to prevent the first and second terminals from being electrically connected with each other through the third substrate.

* * * * *